United States Patent
Cheng et al.

(10) Patent No.: US 8,853,545 B2
(45) Date of Patent: Oct. 7, 2014

(54) TEST CARD WITH A CUTTABLE GOLDFINGER STRUCTURE

(71) Applicant: Wistron Corporation, New Taipei (TW)

(72) Inventors: Kuei-Yung Cheng, New Taipei (TW); Yao-Quan Hu, New Taipei (TW)

(73) Assignee: Wistron Corporation, Hsinchu, New Taipei (TW)

( * ) Notice: Subject to any disclaimer, the term of this patent is extended or adjusted under 35 U.S.C. 154(b) by 99 days.

(21) Appl. No.: 13/798,040

(22) Filed: Mar. 12, 2013

(65) Prior Publication Data

US 2014/0124240 A1    May 8, 2014

(30) Foreign Application Priority Data

Nov. 8, 2012 (CN) .......................... 2012 2 0586626

(51) Int. Cl.
| | |
|---|---|
| H05K 1/00 | (2006.01) |
| H05K 1/03 | (2006.01) |
| H05K 1/09 | (2006.01) |
| H05K 1/11 | (2006.01) |
| H01R 13/58 | (2006.01) |
| H05K 1/14 | (2006.01) |
| H05K 1/02 | (2006.01) |

(52) U.S. Cl.
CPC .................... *H05K 1/0213* (2013.01)
USPC ........... 174/250; 174/255; 174/257; 174/261; 439/59; 439/61; 439/62; 439/475; 361/737

(58) Field of Classification Search
USPC ........... 174/117 F, 17 FF, 250, 254, 255, 257, 174/261; 439/59, 60, 61, 79, 475, 951; 361/737
See application file for complete search history.

(56) References Cited

U.S. PATENT DOCUMENTS

| 5,594,214 | A * | 1/1997 | Liao ........................... 174/117 F |
| 6,193,544 | B1 * | 2/2001 | McGinnis ..................... 439/492 |
| 6,274,819 | B1 * | 8/2001 | Li et al. .......................... 174/254 |
| 7,684,196 | B2 * | 3/2010 | Eckberg et al. ............... 361/707 |
| 2003/0146018 | A1 * | 8/2003 | Sinkunas et al. .............. 174/254 |
| 2006/0042821 | A1 * | 3/2006 | Pax ................. 174/250 |
| 2007/0053170 | A1 * | 3/2007 | Yu ................... 361/737 |
| 2007/0238323 | A1 * | 10/2007 | Mathews et al. ................ 439/65 |
| 2009/0186501 | A1 * | 7/2009 | Kao .............................. 439/153 |

FOREIGN PATENT DOCUMENTS

CN    201709022 U    1/2011

* cited by examiner

*Primary Examiner* — Timothy Thompson
*Assistant Examiner* — Sherman Ng
(74) *Attorney, Agent, or Firm* — Winston Hsu; Scott Margo

(57) ABSTRACT

A test card includes a substrate and a goldfinger structure disposed on a side of the substrate. The goldfinger structure includes a first conductive section and a second conductive section. The first conductive section is inserted into a slot of a socket for electrically connecting to the socket. The second conductive section is connected to the first conductive section in a separable manner, and the second conductive section is inserted into the slot of the socket for electrically connecting to the socket after the first conductive section is cut for separating from the second conductive section.

9 Claims, 6 Drawing Sheets

TEST CARD WITH A CUTTABLE GOLDFINGER STRUCTURE

BACKGROUND OF THE INVENTION

1. Field of the Disclosure

The present disclosure relates to a test card, and more specifically, to a test card with a cuttable goldfinger structure.

2. Description of the Prior Art

Generally speaking, a test card is a consumable product with high price, high damage rate, and high scrap rate in the manufacturing industry of printed circuit boards. That is, after the conventional test card is inserted and unplugged repeatedly, it is easy to peel, wear and scratch a goldfinger structure of the conventional test card, so that it increases a testing defect rate and easily damages testing circuit boards. The test card with the damaged goldfinger structure cannot work properly and needs to scrap. As for the test card with slight wear and scratches, it can be repaired by regilding. However, an effect of regilding is not well, and the goldfinger structure is easy to be damaged again, resulting in bad test efficiency and increasing the test cost.

SUMMARY OF THE INVENTION

The present disclosure is to provide a test card with a cuttable goldfinger structure to solve above problems.

According to the disclosure, a test card includes a substrate and a goldfinger structure disposed on a side of the substrate. The goldfinger structure includes a first conductive section and a second conductive section. The first conductive section is inserted into a slot of a socket for electrically connecting to the socket. The second conductive section is connected to the first conductive section in a separable manner, and the second conductive section is inserted into the slot of the socket for electrically connecting to the socket after the first conductive section is cut for separating from the second conductive section.

According to the disclosure, a first engaging portion, a second engaging portion and a third engaging portion are respectively formed on two sides of the goldfinger structure on the substrate, an engaging component on the socket is for engaging with the second engaging portion as the first conductive section has not been cut and inserted into the slot, the first engaging portion is configured to provide a cut position for cutting the first conductive section, so that the first conductive section is cut for separating from the second conductive section, and the engaging component on the socket is for engaging with the third engaging portion as the second conductive section is inserted into the slot.

According to the disclosure, the first engaging portion, the second engaging portion and the third engaging portion are respectively a concave hole.

According to the disclosure, a scale line is respectively formed on a side of the first engaging portion, a side of the second engaging portion and a side of the third engaging portion, for being a reference line to cut.

According to the disclosure, the goldfinger structure conforms to a Dual Inlined Memory Module interface, a Peripheral Component Interface, a Peripheral Component Interface-Express, a Universal Serial Bus interface, or an Accelerated Graphics Port interface.

According to the disclosure, a width of the first conductive section is substantially equal to a width of the second conductive section.

The present disclosure is to provide the test card with the cuttable goldfinger structures. After the test card is inserted and unplugged repeatedly, the damaged conductive section in use can be cut off so as to use the next good conductive section, instead of scrapping the whole test card or regilding the damaged goldfinger structure. As a result, the test card of the present disclosure has the characteristic of repeated cutting and reuse, so that it can decrease the test cost and increase a utilization rate and test stability.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
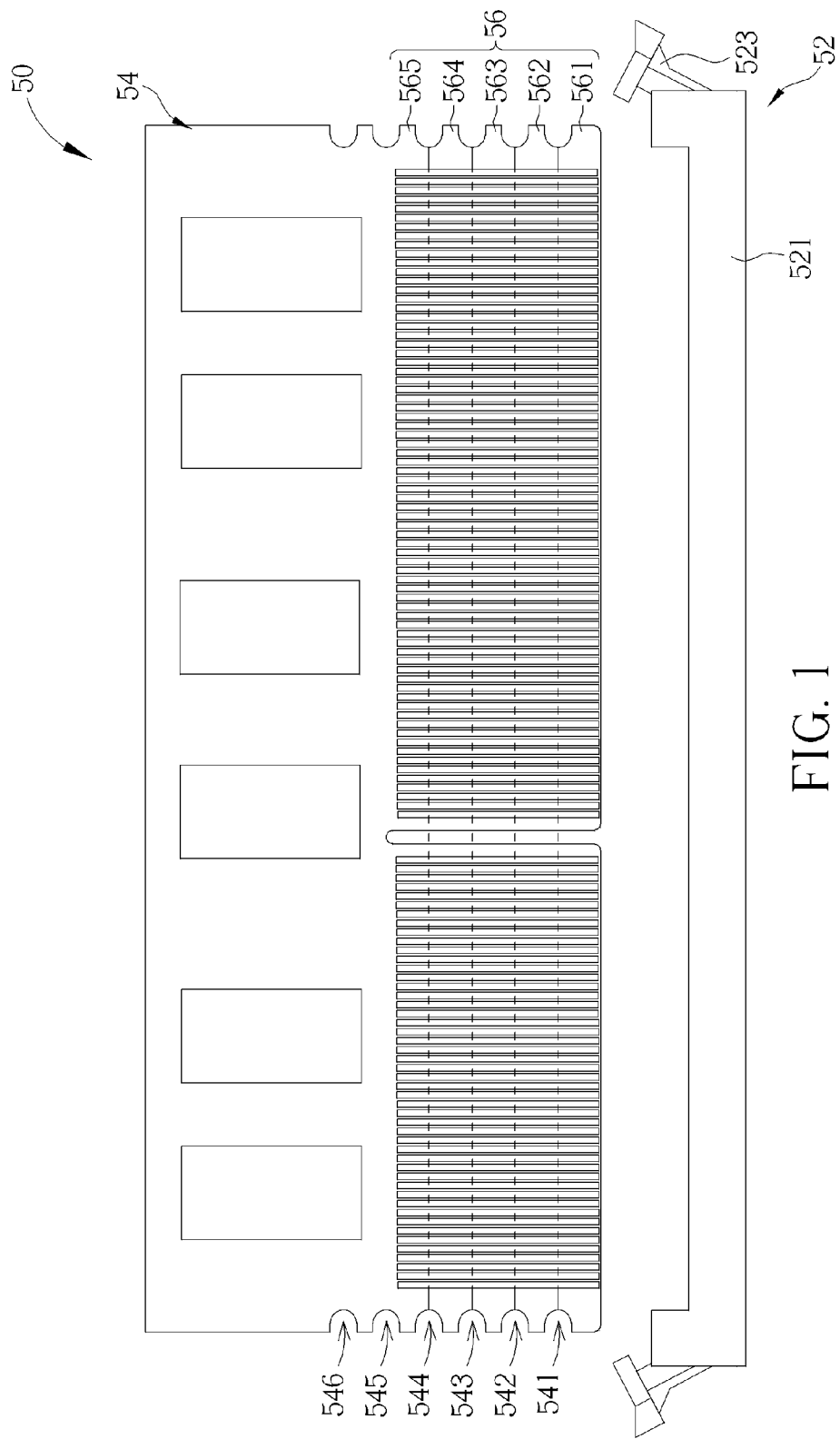
FIG. 1 to FIG. 6 are respectively diagrams of a test card installed and not installed on a socket in different conditions according to an embodiment of the present disclosure.

Please refer to FIG. 1 to FIG. 6. FIG. 1 to FIG. 6 are respectively diagrams of a test card 50 installed and not installed on a socket 52 in different conditions according to an embodiment of the present disclosure. The test card 50 includes a substrate 54 and a goldfinger structure 56. The goldfinger structure 56 is disposed on a side of the substrate 54, and the goldfinger structure 56 is made of electrical conductive material. For example, the goldfinger structure 56 can be processed by gilding or tinning. The goldfinger structure 56 can conform to a Dual Inlined Memory Module (DIMM) interface, a Peripheral Component Interface (PCI), a Peripheral Component Interface-Express (PCI-E), a Universal Serial Bus (USB) interface, or an Accelerated Graphics Port (AGP) interface. That is, the test card 50 can be different interface cards with different signal transmission formats. The test card 50 is for inserting into a slot 521 of the socket 52 for electrically connecting to the socket 52 to execute a testing procedure with a testing circuit board.

The goldfinger structure 56 of the test card 50 includes a plurality of cuttable conductive sections. For example, the goldfinger structure 56 can include a first conductive section 561, a second conductive section 562, a third conductive section 563, a fourth conductive section 564 and a fifth conductive section 565, which are arranged from bottom to top. Adjacent conductive sections are connected to each other in a separable manner, and each conductive section can have the same width, such as 5 mm. An amount of the conductive sections and a whole size of the goldfinger structure 56 are not limited to this embodiment, and it depends on practical design demands. In addition, a first engaging portion 541, a second engaging portion 542, a third engaging portion 543, a fourth engaging portion 544, a fifth engaging portion 545 and a sixth engaging portion 546 are respectively formed on two sides of the goldfinger structure 56 on the substrate 54 and are arranged from bottom to top. Each engaging portion can be respectively a concave hole, and a scale line can be respectively formed on a side of each engaging portion for being a reference line to cut. An amount of the engaging portions is also not limited to this embodiment, and it depends on the amount of the corresponding conductive sections.

Figure 2:
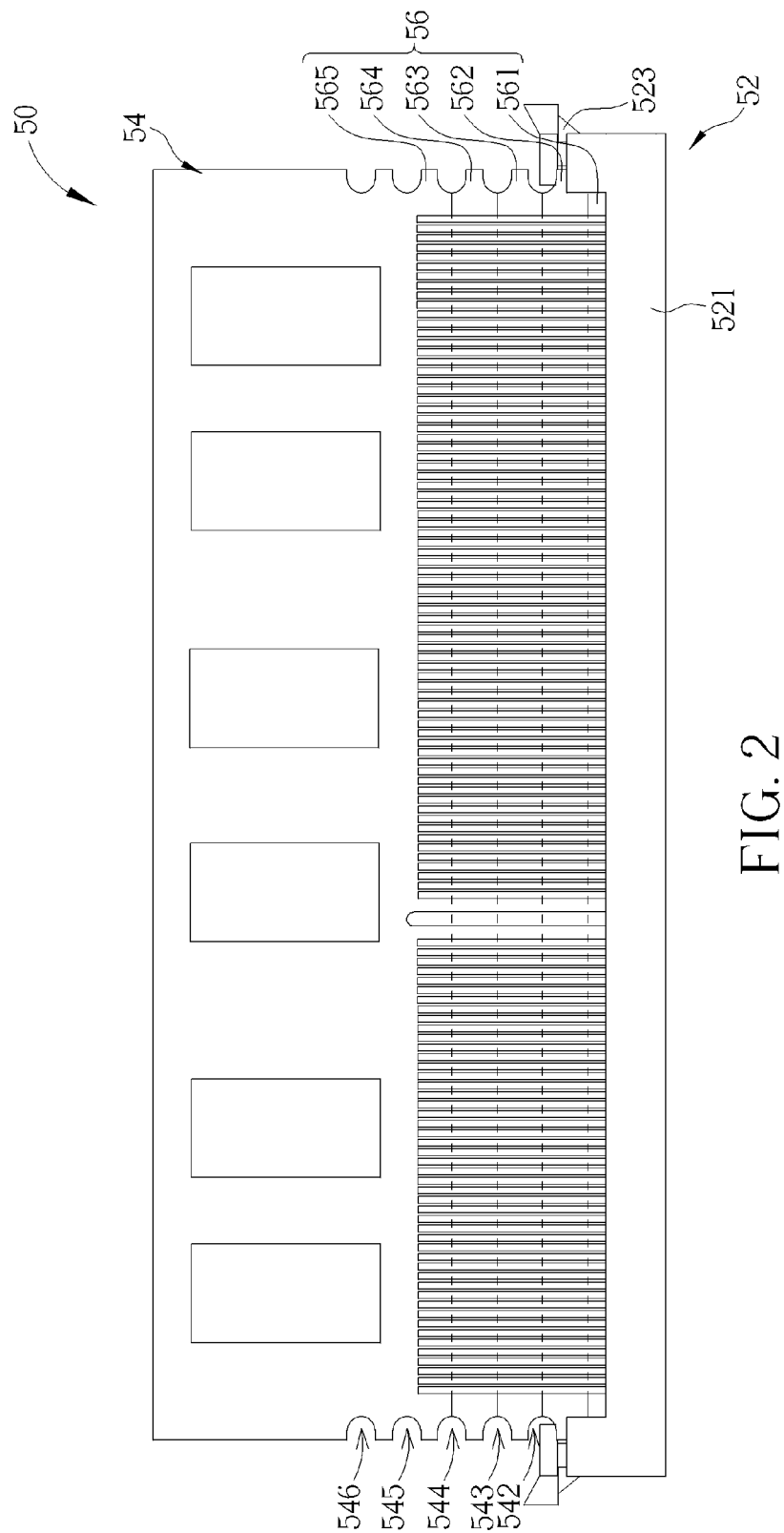

As shown in FIG. 1, as the goldfinger structure 56 of the test card 50 has not been cut, the first conductive section 561 is on a lowest end of the test card 50. At this time, the test card 50 can be installed on the socket 52, as shown in FIG. 2. That is, the first conductive section 561 is inserted into the slot 521 of the socket 52 for electrically connecting to the socket 52.

Figure 3:
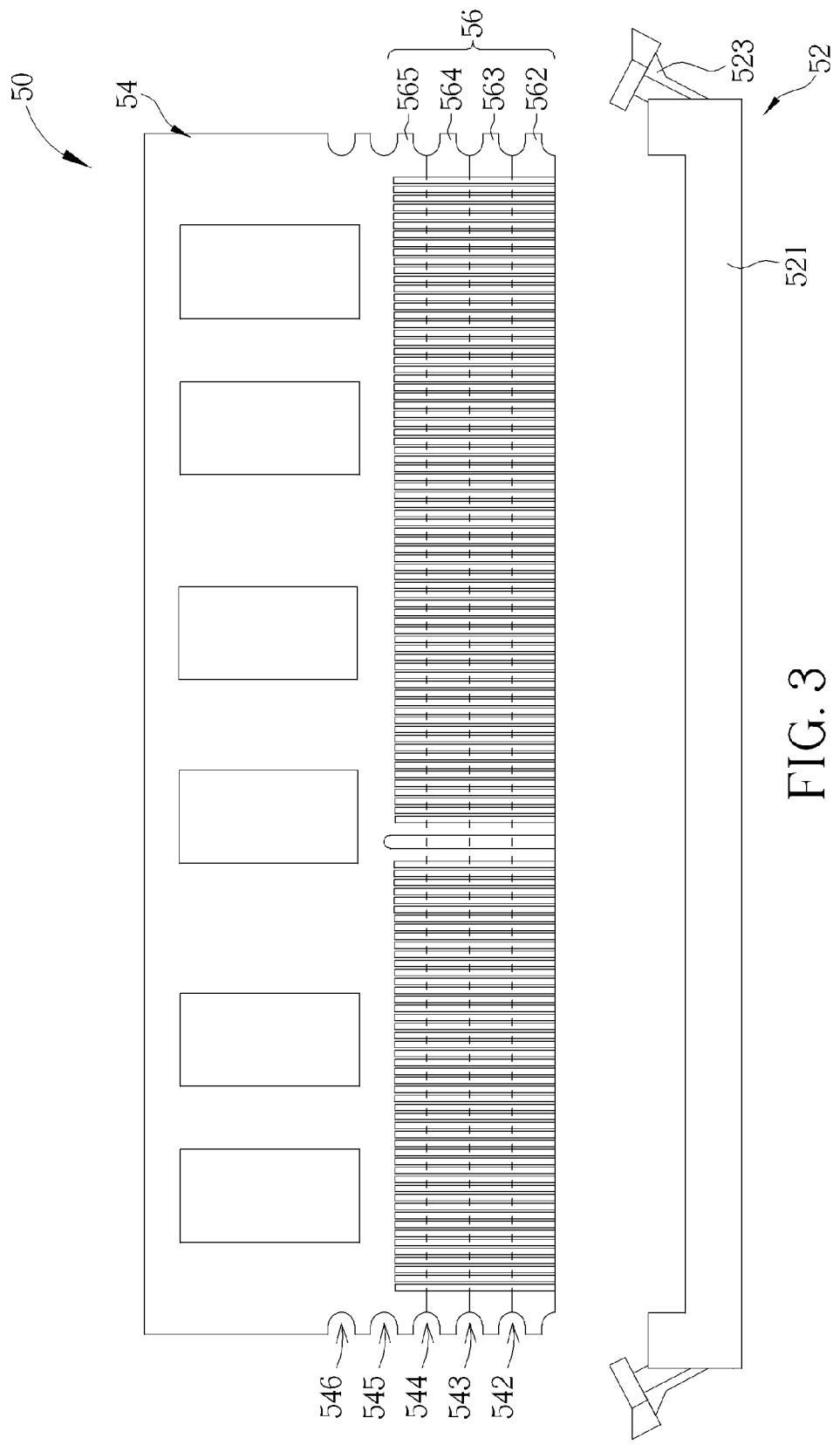
Figure 4:
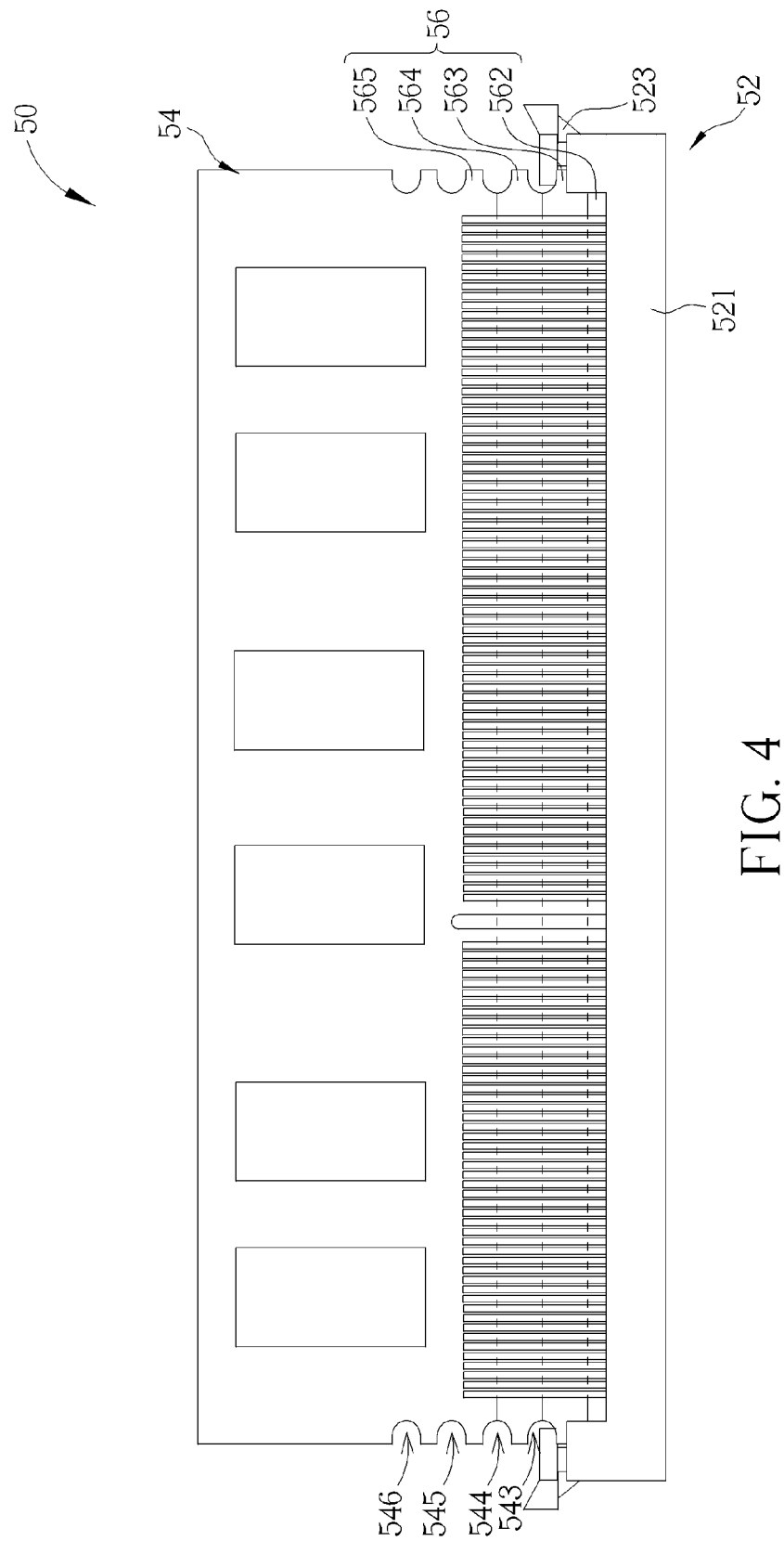

Then, an engaging component 523 on the socket 52 rotates to engage with the second engaging portion 542, so as to fix the test card 50 on the socket 52 stably. However, after the test card 50 is inserted and unplugged repeatedly, the first conductive section 561 for being inserted into the slot 521 may peel, wear and scratch. At this time, the first conductive section 561 can be cut for separating from the second conductive section 562 by the scale line on the first engaging portion 541. That is, the first engaging portion 541 is configured to provide a cut position for cutting the first conductive section 561, and the scale line on the first engaging portion 541 is for being the reference line to cut. After cutting the first conductive section 561 from the second conductive section 562, as shown in FIG. 3, the second conductive section 562 is on the lowest end of the test card 50, and the test card 50 can be installed on the socket 52 as shown in FIG. 4. That is, the second conductive section 562 is inserted into the slot 521 of the socket 52 for electrically connecting the socket 52. Then, the engaging component 523 on the socket 52 rotates to engage with the third engaging portion 543, so as to fix the test card 50 on the socket 52 stably.

Figure 5:
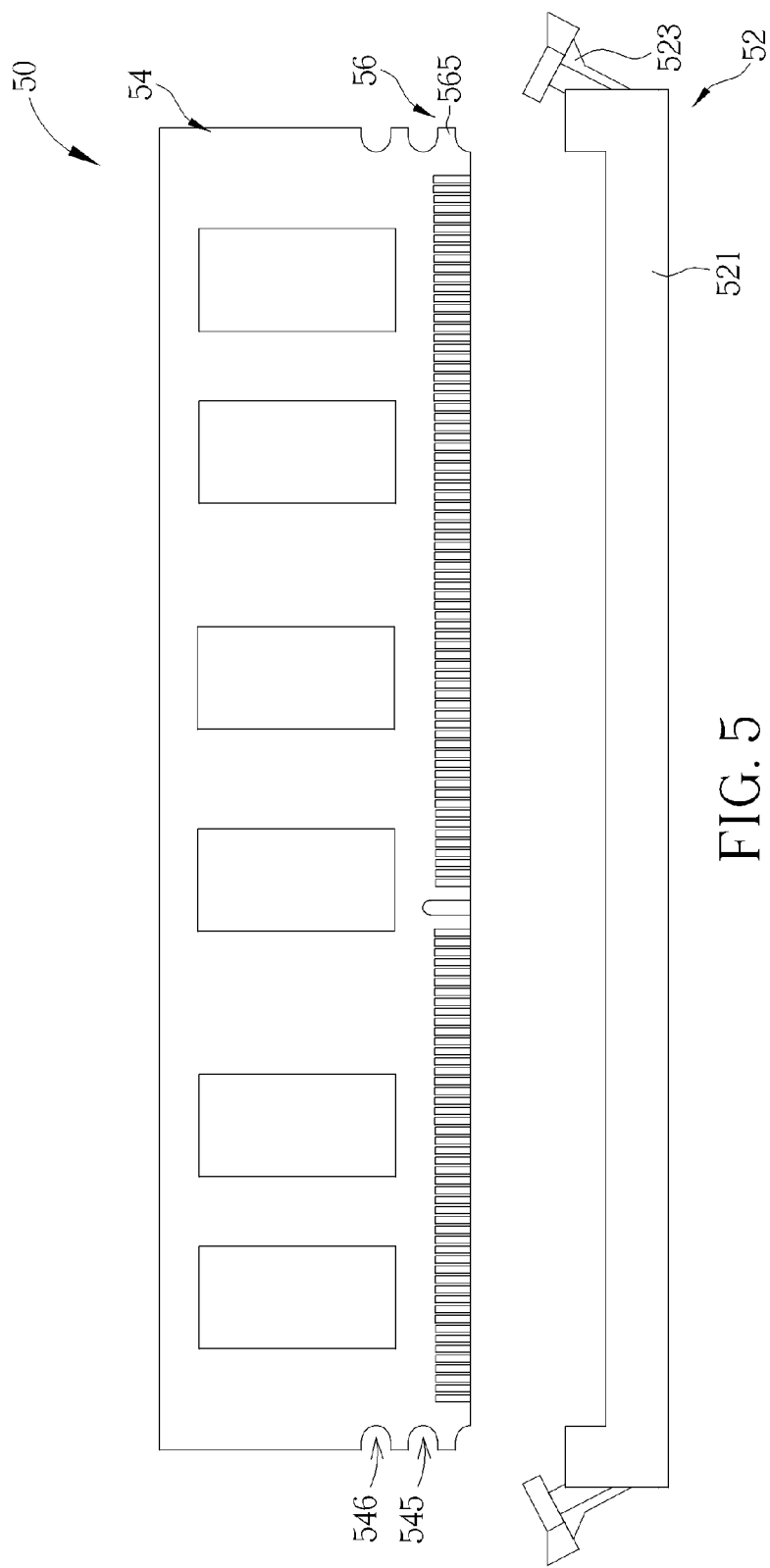
Figure 6:
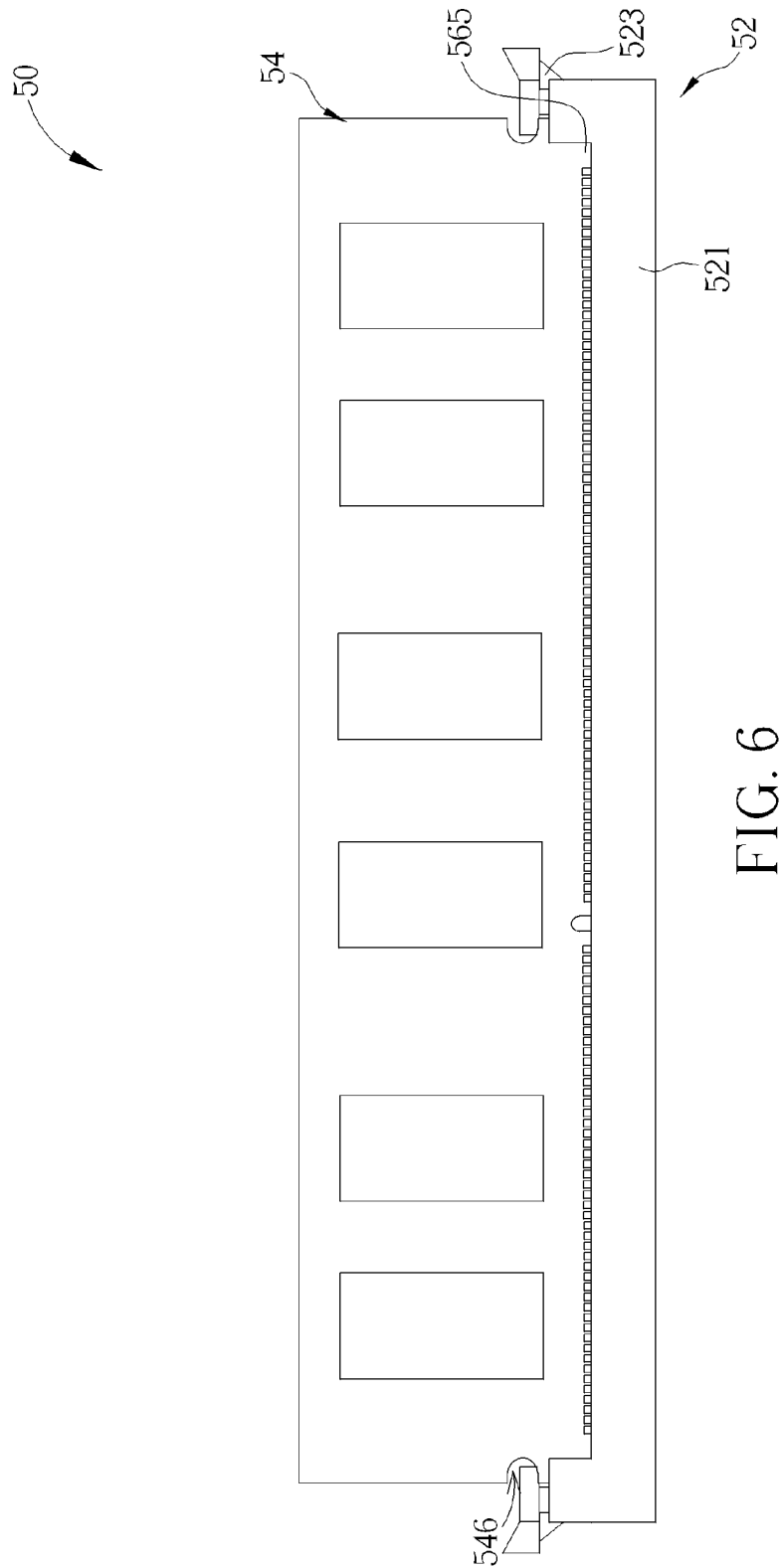

The goldfinger structure 56 of the test card 50 of the present disclosure has a characteristic of cutting multiple conductive sections, so that it can achieve a purpose of scrapping the damaged conductive sections by repeated cutting. Please refer to FIG. 5 and FIG. 6. As the last conductive section of the goldfinger structure 56 is used, that is, the fourth conductive section 564 can be cut for separating from the fifth conductive section 565 by the scale line on the fourth engaging portion 544. At this time, as shown in FIG. 5, the fifth conductive section 565 is on the lowest end of the test card 50, and the test card 50 can be installed on the socket 52 as shown in FIG. 6. That is, the fifth conductive section 565 is inserted into the slot 521 of the socket 52 for electrically connecting the socket 52. Then, the engaging component 523 on the socket 52 rotates to engage with the sixth engaging portion 546, so as to fix the test card 50 on the socket 52 stably. In conclusion, after the test card 50 is inserted and unplugged repeatedly, the damaged conductive section in use can be cut off so as to use a next good conductive section, instead of scrapping the whole test card 50 or regilding the damaged goldfinger structure 56. As for an operational principle of the third conductive section 563 and the fourth conductive section 564 or other conductive sections, it is the same as the previous embodiment and is omitted herein.

In contrast to the prior art, the present disclosure is to provide the test card with the cuttable goldfinger structures. After the test card is inserted and unplugged repeatedly, the damaged conductive section in use can be cut off so as to use the next good conductive section, instead of scrapping the whole test card or regilding the damaged goldfinger structure. As a result, the test card of the present disclosure has the characteristic of repeated cutting and reuse, so that it can decrease the test cost and increase a utilization rate and test stability.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A test card, comprising:
   a substrate; and
   a goldfinger structure disposed on a side of the substrate, the goldfinger structure comprising:
   a first conductive section for being inserted into a slot of a socket for electrically connecting to the socket; and
   a second conductive section connected to the first conductive section in a separable manner, and the second conductive section being inserted into the slot of the socket for electrically connecting to the socket after the first conductive section is cut for separating from the second conductive section.

2. The test card of claim 1, wherein a first engaging portion, a second engaging portion and a third engaging portion are respectively formed on two sides of the goldfinger structure on the substrate, an engaging component on the socket is for engaging with the second engaging portion as the first conductive section has not been cut and inserted into the slot, the first engaging portion is configured to provide a cut position for cutting the first conductive section, so that the first conductive section is cut for separating from the second conductive section, and the engaging component on the socket is for engaging with the third engaging portion as the second conductive section is inserted into the slot.

3. The test card of claim 2, wherein the first engaging portion, the second engaging portion and the third engaging portion are respectively a concave hole.

4. The test card of claim 3, wherein a scale line is respectively formed on a side of the first engaging portion, a side of the second engaging portion and a side of the third engaging portion, for being a reference line to cut.

5. The test card of claim 2, wherein a scale line is respectively formed on a side of the first engaging portion, a side of the second engaging portion and a side of the third engaging portion, for being a reference line to cut.

6. The test card of claim 1, wherein the goldfinger structure conforms to a Dual Inlined Memory Module interface, a Peripheral Component Interface, a Peripheral Component Interface-Express, a Universal Serial Bus interface, or an Accelerated Graphics Port interface.

7. The test card of claim 1, wherein a width of the first conductive section is substantially equal to a width of the second conductive section.

8. The test card of claim 1, wherein the first conductive section substantially has a width of 5 mm.

9. The test card of claim 1, wherein the second conductive section substantially has a width of 5 mm.

* * * * *

UNITED STATES PATENT AND TRADEMARK OFFICE
CERTIFICATE OF CORRECTION

Page 1 of 1

PATENT NO. : 8,853,545 B2
APPLICATION NO. : 13/798040
DATED : October 7, 2014
INVENTOR(S) : Kuei-Yung Cheng et al.

It is certified that error appears in the above-identified patent and that said Letters Patent is hereby corrected as shown below:

On the title page, item (73), correct the residence of the assignee from "Hsinchu, New Taipei (TW)" to --Hsichih, New Taipei (TW)--.

Signed and Sealed this
Sixth Day of January, 2015

Michelle K. Lee
*Deputy Director of the United States Patent and Trademark Office*